(12) United States Patent
Hung et al.

(10) Patent No.: US 12,181,495 B2
(45) Date of Patent: Dec. 31, 2024

(54) TEST DEVICE

(71) Applicant: Quanta Computer Inc., Taoyuan (TW)

(72) Inventors: Wei-Chih Hung, Taoyuan (TW);
Ying-Ping Chiang, Taoyuan (TW);
Yu-Ren Ruan, Taoyuan (TW);
Chia-Hao Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 151 days.

(21) Appl. No.: 18/061,502

(22) Filed: Dec. 5, 2022

(65) Prior Publication Data

US 2024/0069067 A1 Feb. 29, 2024

(30) Foreign Application Priority Data

Aug. 30, 2022 (TW) .................................. 111132709

(51) Int. Cl.
*G01R 1/067* (2006.01)
*G01R 1/30* (2006.01)
*G01R 1/44* (2006.01)

(52) U.S. Cl.
CPC ..... *G01R 1/06766* (2013.01); *G01R 1/06777* (2013.01); *G01R 1/30* (2013.01); *G01R 1/44* (2013.01)

(58) Field of Classification Search
CPC .. G01R 1/06766; G01R 1/06777; G01R 1/30; G01R 1/44; G01R 31/005; G01R 31/42

See application file for complete search history.

(56) References Cited

U.S. PATENT DOCUMENTS

| | | | |
|---|---|---|---|
| 2012/0105072 A1* | 5/2012 | Peterson | G01R 31/42 |
| | | | 324/511 |
| 2018/0077818 A1* | 3/2018 | Harkins | H05K 7/209 |
| 2019/0084841 A1* | 3/2019 | Prakash | C02F 1/008 |
| 2022/0037955 A1* | 2/2022 | Wang | H02K 9/193 |

FOREIGN PATENT DOCUMENTS

| | | | | |
|---|---|---|---|---|
| DE | 102021113004 B3 * | 6/2022 | | G01R 31/42 |
| TW | 201217811 A | 5/2012 | | |

OTHER PUBLICATIONS

S. Liebig et al., E-Motor Emulator—Testing Power Electronics without Motor, EVS30 Symposium, Stuttgart, Germany, Oct. 9-11, 2017 (Year: 2017).*
M. Paškala, M. Prídala, M. Pipíška and P. Hudák, "The support system for testing the power converters: The system of water cooling / heating," 2016 ELEKTRO, Strbske Pleso, Slovakia, 2016, pp. 196-200 (Year: 2016).*
Chinese language office action dated Jan. 9, 2024, issued in application No. TW 111132709.

* cited by examiner

*Primary Examiner* — Daniel R Miller
(74) *Attorney, Agent, or Firm* — McClure, Qualey & Rodack, LLP

(57) ABSTRACT

A test device includes a power compensation module and a test module. The power compensation module receives AC power generated by a device under test to generate DC power to the device under test. The test module provides a plurality of test signals and a test mode to the device under test for testing the device under test.

5 Claims, 2 Drawing Sheets

TEST DEVICE

CROSS REFERENCE TO RELATED APPLICATIONS

This application claims priority of Taiwan Patent Application No. 111132709, filed on Aug. 30, 2022, the entirety of which is incorporated by reference herein.

TECHNICAL FIELD

The present invention relates to a test device, and in particular it relates to a test device for a vehicle motor driver.

BACKGROUND

In general, vehicle motor drivers are tested after completion to determine whether they meet requirements. However, the test platform for a vehicle motor driver is expensive and has high site requirements. In addition, the cost of building such a test platform is high, and the test platform must be large in size. Moreover, the test platform consumes a large amount of power. All of these disadvantages cause it to be inconvenient to use. Therefore, how to save the power consumption, and reduce the building cost and size of test devices has become a focus for technical improvements by various manufacturers.

SUMMARY

An embodiment of the present invention provides a test device, thereby effectively saving the power consumption, reducing the building cost and size of the test device, and increasing the convenience of use.

An embodiment of the present invention provides a test device, which includes a power compensation module and a test module. The power compensation module is configured to receive AC power generated by a device under test to generate DC power to the device under test. The test module is configured to provide a plurality of test signals and a test mode to the device under test for testing the device under test.

According to the test device disclosed by the present invention, the power compensation module receives the AC power generated by the device under test to generate the DC power to the device under test, and the test module provides the test signals and the test modes to the device under test for testing the device under test. Therefore, the power consumption may be effectively saved, the building cost, and size of the test device may be reduced, and the convenience of use is increased.

BRIEF DESCRIPTION OF DRAWINGS

The present invention can be more fully understood by reading the subsequent detailed description and examples with references made to the accompanying drawings, wherein.

DETAILED DESCRIPTION OF DISCLOSED EMBODIMENTS

In each of the following embodiments, the same reference number represents an element or component that is the same or similar.

Figure 1:
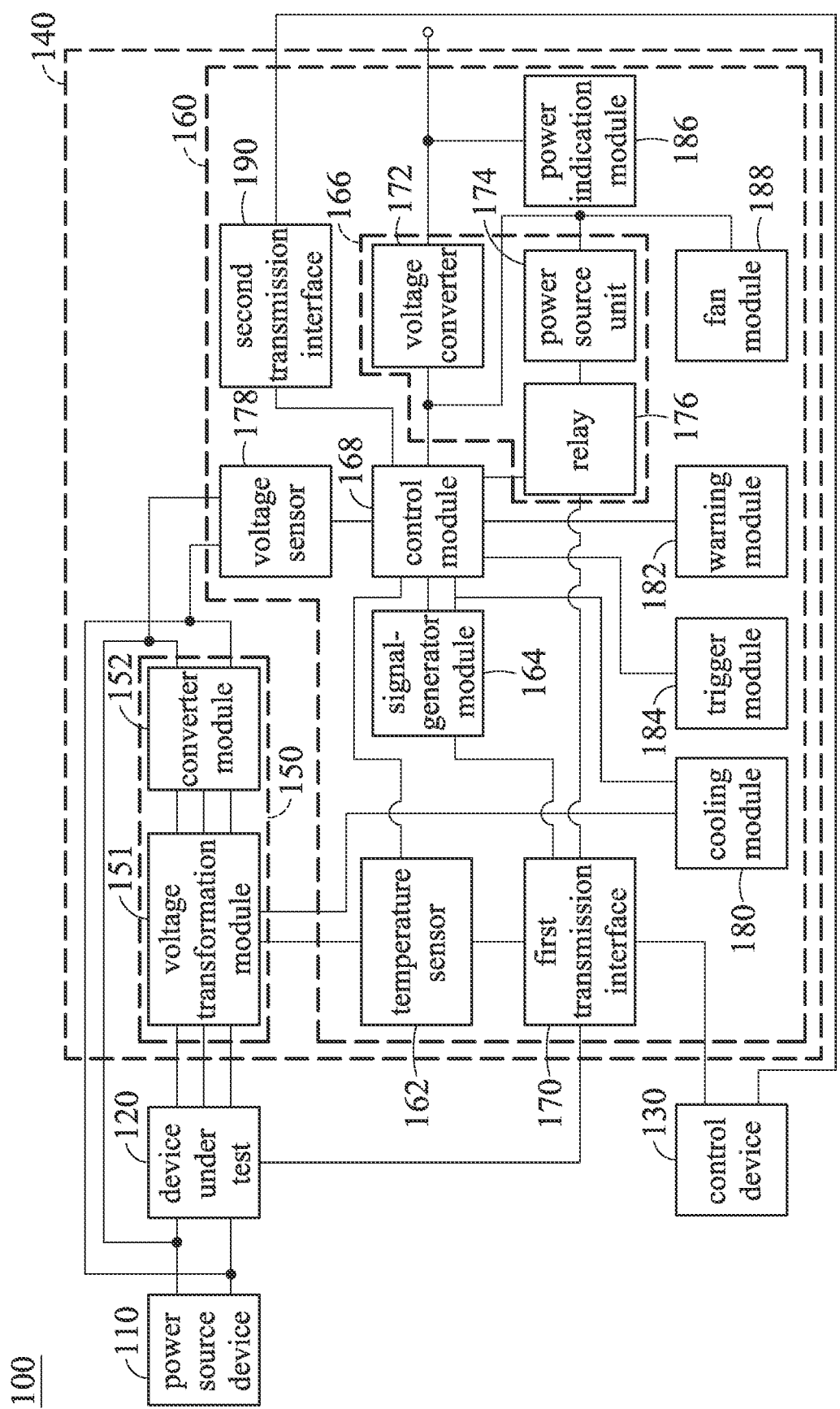
FIG. 1 is a schematic view of a test system according an embodiment of the present invention.

FIG. 1 is a schematic view of a test system according an embodiment of the present invention. Please refer to FIG. 1. The test system 100 includes a power source device 110, a device under test 120, a control device 130 and a test device 140.

The power source device 110 provides DC power. In the embodiment, the power source device 110 may be a DC power supply, and may provide, for example, the DC power of 36 kW, but the present invention is not limited thereto.

The device under test 120 is connected to the power source device 110. The device under test 120 receives the DC power provided by the power source device 110 to generate AC power. In the embodiment, the device under test 120 is, for example, a vehicle inverter, a vehicle motor driver or a controller used in an electric vehicle, but the present invention is not limited thereto. Furthermore, when the device under test 120 receives the DC power, the device under test 120 may convert the DC power into a three-phase AC power through, for example, an internal PI controller, an inverse Park transform and a space vector pulse width modulation (SVPWM).

The control device 130 may provide a test mode. In the embodiment, the control device 130 may be a computer, but the present invention is not limited thereto. In addition, the above test mode includes, for example, a static load test mode and a dynamic load test mode, but the present invention is not limited thereto.

The test device 140 is connected to the device under test 120 and the control device 130. The test device 140 may include a power compensation module 150 and a test module 160. The power compensation module 150 is connected to the device under test 120. The power compensation module 150 receives the AC power generated by the device under test 120 to generate the DC power to the device under test 120. Therefore, the power compensation module 150 is used to generate the DC power, and the DC power is fed back to an input terminal of the device under test 120, so as to form a closed-loop power transmission path, thereby effectively saving the power consumption.

Furthermore, the power compensation module 150 may include a voltage transformation module 151 and a converter module 152. The voltage transformation module 151 is connected to the device under test 120. The voltage transformation module 151 receives the three-phase AC power generated by the device under test 120 generate a three-phase voltage transforming power. In the embodiment, the voltage transformation module 151 may be a transformer, but the present invention is not limited thereto. The converter module 152 is connected to the voltage transformation module 151. The converter module 152 receives the three-phase voltage transforming power, converts the three-phase voltage transforming power into the two-phase DC power, and outputs the DC power to the device under test 120. In the embodiment, the converter module 152 may be an AC-DC convertor, but the present invention is not limited thereto.

The test module 160 is connected to the device under test 120, the control device 130 and the power compensation module 150. The test module 160 may provide a plurality of test signals and a test mode provided by the control device 130 to the device under test 120 for testing the device under test 120.

Furthermore, the test module 160 may include a temperature sensor 162, a signal-generator module 164, a voltage-generator module 166, a control module 168 and first transmission interface 170.

The temperature sensor 162 may sense the temperature of the power compensation module 150 to generate a temperature signal. Furthermore, in some embodiments, the temperature sensor 162 may be connected to the voltage transformation module 151 of the power compensation module 150, so as to sense the temperature generated by the voltage transformation module 151 and generate a corresponding temperature signal. In some embodiments, the temperature sensor 162 may be disposed adjacent to the voltage transformation module 151 of the power compensation module 150, so as to in order to sense the temperature generated by the voltage transformation module 151 and generate a corresponding temperature signal.

The signal-generator module 164 may generate a rotational speed signal according to the first control signal. The voltage-generator module 166 may generate a voltage signal according to the second control signal and the external voltage. In the embodiment, the voltage signal is, for example, a voltage of 12V, but the present invention is not limited thereto.

The control module 168 may be connected to the signal-generator module 164 and the voltage-generator module 166. The control module 168 may generate the first control signal to the signal-generator module 164 and generate the second control signal to the voltage-generator module 166. In the embodiment, the control module 168 may be a programmable logic controller (PLC) or another suitable controller, but the present invention is not limited thereto.

The first transmission interface 170 may be connected to the temperature sensor 162, the signal-generator module 164, the voltage-generator module 166 and the control device 130. The first transmission interface 170 is configured to transmit the temperature signal of the temperature sensor 162, the rotational speed signal of the signal-generator module 164, the voltage signal of the voltage-generator module 166 and the test mode of the control device 130 to the device under test 120, so as to perform the corresponding test on the device under test 120.

In the embodiment, the voltage-generator module 166 may include a voltage converter 172, a power source unit 174 and a relay 176. The voltage converter 172 may receive the external voltage and convert the external voltage to the working voltage. The power source unit 174 is connected to the voltage converter 172. The power source unit 174 may receive the working voltage generated by the voltage converter 172, and generate the voltage signal according to the working voltage. The relay 176 may be connected to the power source unit 174 and control module 168. The relay 176 may receive the voltage signal and the second control signal, and provide the voltage signal to the first transmission interface 170 according to the second control signal.

In the embodiment, the test module 160 further includes a voltage sensor 178, a cooling module 180, a warning module 182, a trigger module 184, a power indication module 186, a fan module 188 and a second transmission interface 190.

The voltage sensor 178 is connected to the converter module 152 of the power compensation module 150 and the control module 168. The voltage sensor 178 senses the DC power to generate a voltage sensing signal to the control module 168.

Figure 2:
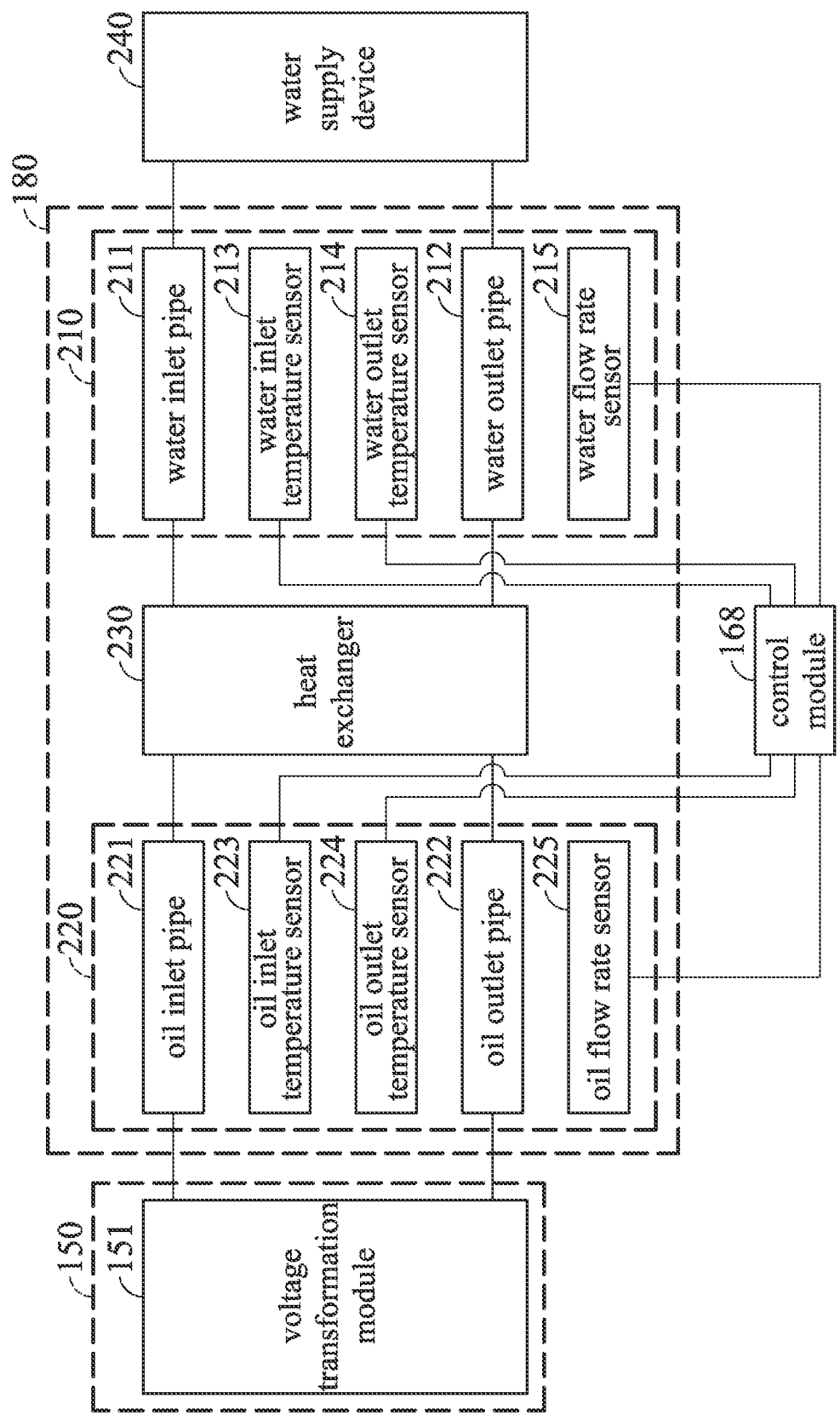
FIG. 2 is a schematic view of a cooling module device according an embodiment of the present invention.

The cooling module 180 is connected to the power compensation module 150, so as to cool the power compensation module 150 and provide cooling information to the control module 168. Furthermore, the cooling module 180 may include a water supply unit 210, an oil supply unit 220 and a heat exchanger 230, as shown in FIG. 2.

The water supply unit 210 may be connected to a water supply device 240. The water supply unit 210 may provide cooling water from the water supply device 240, and to output high-temperature water to the water supply device 240. In the embodiment, the water supply device 240 may be a chiller, but the present invention is not limited thereto. The oil supply unit 220 may be connected to the voltage transformation module 151 of the power compensation module 150, so as to provide cooling oil to the voltage transformation module 151 of the power compensation module 150 to cool the voltage transformation module 151 and to output high-temperature oil generated by cooling the voltage transformation module 151 of the power compensation module 150.

The heat exchanger 230 may be connected to the water supply unit 210 and the oil supply unit 220. The heat exchanger 230 may receive the cooling water and the high-temperature oil, and use the cooling water to cool the high-temperature oil, so as to generate the cooling oil and the high-temperature water. That is, the cooling module 180 of the embodiment may be an oil-water separation structure, so as to cool (by dissipating the heat of) the voltage transformation module 151 of the power compensation module 150.

In some embodiments, the water supply unit 210 may include a water inlet pipe 211, a water outlet pipe 212, a water inlet temperature sensor 213, a water outlet temperature sensor 214 and a water flow rate sensor 215. The water inlet pipe 211 is connected to the water supply device 240 and the heat exchanger 230, and provides the cooling water to the heat exchanger 230 from the water supply device 240. The water outlet pipe 212 is connected to the heat exchanger 230 and the water supply device 240, and outputs the high-temperature water generated by the heat exchanger 230 to the water supply device 240 for cooling.

The water inlet temperature sensor 213 may be disposed on the water inlet pipe 211 or within the water inlet pipe 211, and is connected to the control module 168. The water inlet temperature sensor 213 may sense the temperature of the water inlet pipe 211, so as to generate a corresponding temperature signal to the control module 168. The water outlet temperature sensor 214 may be disposed on the water outlet pipe 212 or within the water outlet pipe 212, and is connected to the control module 168. The water outlet temperature sensor 214 may sense the temperature of the water outlet pipe 212, so as to generate a corresponding temperature signal to the control module 168. The water flow rate sensor 215 may be disposed within the water outlet pipe 212, and is connected to the control module 168. The water flow rate sensor 215 may sense the water flow rate within the water outlet pipe 212, so as to in order to generate a corresponding water flow rate signal to the control module 168.

The oil supply unit 220 may include an oil inlet pipe 221, an oil outlet pipe 222, an oil inlet temperature sensor 223, an oil outlet temperature sensor 224 and an oil flow rate sensor 225. The oil inlet pipe 221 is connected to the heat exchanger 230 and the voltage transformation module 151 of the power compensation module 150, and provides the cooling oil to the voltage transformation module 151 from the heat exchanger 230, so as to cool the voltage transformation module 151. The oil outlet pipe 222 is connected to the voltage transformation module 151 of the power compensation module 150, and outputs the high-temperature oil generated by the voltage transformation module 151 to the heat exchanger 230 for cooling.

The oil inlet temperature sensor 223 may be disposed on the oil inlet pipe 221 or within the oil inlet pipe 221, and is connected to the control module 168. The oil inlet temperature sensor 223 may sense the temperature of the oil inlet pipe 221, so as to generate a corresponding temperature signal to the control module 168. The oil outlet temperature sensor 224 may be disposed on the oil outlet pipe 222 or within the oil outlet pipe 222, and is connected to the control module 168. The oil outlet temperature sensor 224 may sense the temperature of the oil outlet pipe 222, so as to generate a corresponding temperature signal to the control module. 168. The oil flow rate sensor 225 may be disposed within the oil outlet pipe 222, and is connected to the control module 168. The oil flow rate sensor 225 may sense the oil flow rate within the oil outlet pipe 222, so as to generate a corresponding oil flow rate signal to the control module 168.

In the embodiment, the cool information generated by the cooling module 180 includes the temperature signal generated by the water inlet temperature sensor 213, the temperature signal generated by the water outlet temperature sensor 214, the water flow rate signal generated by the water flow rate sensor 215, the temperature signal generated by the oil inlet temperature sensor 223, the temperature signal generated by the oil outlet temperature sensor 224 and the oil flow rate signal generated by the oil flow rate sensor 225.

The warning module 182 is connected to the control module 168. The warning module 182 may receive and display a warning signal generated by the control module 168, wherein the warning signal is generated by the control module 168 according to the voltage sensing signal and/or the temperature signal. For example, when the control module 168 receives the voltage sensing signal, the control module 168 may compare the voltage sensing signal with a predetermined voltage, so as to determine whether to generate the warning signal. When the control module 168 determines that the voltage sensing signal is consistent with predetermined voltage, it indicates that the DC power is abnormal. Accordingly, the control module 168 may generate the warning signal, so that the warning module 182 may display the warning signal. When the control module 168 determines that the voltage sensing signal is consistent with the predetermined voltage, it indicates that the DC power is normal. Accordingly, the control module 168 may not generate the warning signal.

In addition, when the control module 168 receives the temperature signal, the control module 168 may compare the temperature signal with a predetermined temperature, so as to determine whether to generate the warning signal. When the control module 168 determines that the temperature signal is greater than or equal to the predetermined temperature, it indicates that the voltage transformation module 151 of the power compensation module 150 is too high. Accordingly, the control module 168 may generate the warning signal, so that the warning module 182 may display warning signal. When the control module 168 determines that the temperature signal is less than the predetermined temperature, it indicates that the voltage transformation module 151 of the power compensation module 150 is not too high. Accordingly, the control module 168 may not generate the warning signal. Therefore, the user may know the state of the DC power and/or the voltage transformation module 151 of the power compensation module 150 through the display state of the warning module 182, so as to perform subsequent processing. In the embodiment, the warning module 182 is, for example, a light-emitting diode or an indication light, but the present invention is not limited thereto.

The trigger module 184 is connected to the control module 168. The trigger module 184 may generate a trigger signal to the control module 168, so that the control module 168 stops the operation of the test device 140 according to the trigger signal. In the embodiment, the trigger module 184 may be a button, but the present invention is not limited thereto. That is, the user may press the trigger module 184, so as to generate a trigger signal. Then, when the control module 168 receives the trigger signal, the control module 168 may stop the operation of the test device 140 according to the trigger signal. Therefore, when the user finds that the test device 140 has an emergency or abnormal situation, the user may operate the trigger module 184 to stop the operation of the test device 140, so as to increase the convenience of use.

The power indication module 186 may be connected to the voltage converter 172 of the voltage-generator module 166. The power indication module 186 may indicate whether the test device 140 is connected to the external voltage. In the embodiment, the power indication module 186 is, for example, a light-emitting diode or an indication light, but the present invention is not limited thereto. That is, when the power indication module 186 receives the external voltage, the power indication module 186 may generate, for example, corresponding light to indicate that the test device 140 is connected to the external voltage. When the power indication module 186 does not receive the external voltage, the power indication module 186 may not generate light to indicate that the test device 140 is not connected to the external voltage.

The fan module 188 may be connected to the voltage converter 172 of the voltage-generator module 166. The fan module 188 may receive the working voltage to dissipate heat from the test device 140. The second transmission interface 190 may be connected to the control module 168 and the control device 130. The second transmission interface 190 may transmit the voltage sensing signal, the temperature signal and the cooling information to the control device 130. That is, the control device 130 may transmit the read command to the control module 168 through the second transmission interface 190, so that the control module 168 outputs the received voltage sensing signal, the received temperature signal and the received cooling information to the control device 130. Therefore, the user may know the operation state of the test device 140 through the control device 130. In addition, the control device 130 may provide the test mode and control the control module 168. The control device 130 may also provide the test parameters to the device under test 120 through the first transmission interface 170, so as to test the device under test 120. Therefore, the testing time and labor costs may also be saved.

In summary, according to the test device disclosed by the embodiment of the present invention, the power compensation module receives the AC power generated by the device under test to generate the DC power to the device under test, and the test module provides the test signals and the test mode to the device under test for testing the device under test. Therefore, the power consumption may be effectively saved, the building cost and size of the test device may be reduced, and the convenience of use is increased. In addition, the test module of the embodiment further includes the cooling module, so as to cool the test device and the power compensation module, to prevent the temperature of the test device from being too high during the test.

While the present invention has been described by way of example and in terms of the preferred embodiments, it should be understood that the present invention is not limited to the disclosed embodiments. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A test device, comprising:
a power compensation module, configured to receive AC power generated by a device under test to generate DC power to the device under test; and
a test module, configured to provide a plurality of test signals and a test mode to the device under test for testing the device under test;
wherein the test module comprises:
a temperature sensor, configured to sense temperature of the power compensation module to generate a temperature signal;
a signal-generator module, configured to generate a rotational speed signal according to a first control signal;
a voltage-generator module, configured to generate a voltage signal according to a second control signal and an external voltage;
a control module, configured to generate the first control signal and the second control signal; and
a first transmission interface, configured to transmit the temperature signal, the rotational speed signal, the voltage signal and a test mode to the device under test;
wherein the voltage-generator module comprises:
a voltage converter, configured to convert the external voltage to a working voltage;
a power source unit, configured to generate the voltage signal according to the working voltage; and
a relay, configured to provide the voltage signal to the first transmission interface according to the second control signal.

2. The test device as claimed in claim 1, wherein the power compensation module comprises:
a voltage transformation module, configured to receive the AC power to generate voltage transforming power; and
a converter module, configured to receive the voltage transforming power and convert the voltage transforming power into the DC power.

3. The test device as claimed in claim 1, wherein the test module further comprises:
a voltage sensor, configured to sense the DC power to generate a voltage sensing signal to the control module;
a cooling module, configured to cool the power compensation module and provide cooling information to the control module;
a warning module, configured to receive and display a warning signal generated by the control module, wherein the warning signal is generated by the control module according to the voltage sensing signal and/or the temperature signal;
a trigger module, configured to generate a trigger signal to the control module, so that the control module stops an operation of the test device according to the trigger signal;
a power indication module, configured to indicate whether the test device is connected to the external voltage;
a fan module, configured to receive the working voltage to dissipate heat from the test device; and
a second transmission interface, configured to transmit the voltage sensing signal, the temperature signal and the cooling information to a control device.

4. The test device as claimed in claim 3, wherein the cooling module comprises:
a water supply unit, configured to provide cooling water and to output high-temperature water;
an oil supply unit, configured to provide cooling oil to the power compensation module and to output high-temperature oil from the power compensation module; and
a heat exchanger, configured to receive the cooling water and the high-temperature oil, and use the cooling water to cool the high-temperature oil, so as to generate the cooling oil and the high-temperature water.

5. The test device as claimed in claim 4, wherein the water supply unit comprises a water inlet temperature sensor, a water outlet temperature sensor and a water flow rate sensor, and the oil supply unit comprises an oil inlet temperature sensor, an oil outlet temperature sensor and an oil flow rate sensor, wherein the water inlet temperature sensor, the water outlet temperature sensor, the water flow rate sensor, the oil inlet temperature sensor, the oil outlet temperature sensor and the oil flow rate sensor provide the cooling information.

* * * * *